United States Patent
Chen et al.

(10) Patent No.: US 8,928,127 B2
(45) Date of Patent: Jan. 6, 2015

(54) NOISE DECOUPLING STRUCTURE WITH THROUGH-SUBSTRATE VIAS

(75) Inventors: Chia-Chung Chen, Keelung (TW); Chewn-Pu Jou, Hsin-Chu (TW); Sally Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 607 days.

(21) Appl. No.: 12/889,650

(22) Filed: Sep. 24, 2010

(65) Prior Publication Data

US 2012/0074515 A1 Mar. 29, 2012

(51) Int. Cl.
*H01L 23/552* (2006.01)
*H01L 23/58* (2006.01)

(52) U.S. Cl.
CPC ....... *H01L 23/585* (2013.01); *H01L 2223/6616* (2013.01); *H01L 2924/0002* (2013.01)
USPC .................................. 257/659; 257/E29.009

(58) Field of Classification Search
CPC ... H01L 23/481; H01L 23/585; H01L 23/552; H01L 23/64; H01L 23/66
USPC .................. 257/409, 508, 659, 665, E29.009, 257/E29.012, E29.013
See application file for complete search history.

(56) References Cited

U.S. PATENT DOCUMENTS

| | | | |
|---|---|---|---|
| 5,151,770 A * | 9/1992 | Inoue ............................. | 257/508 |
| 5,391,917 A | 2/1995 | Gilmour et al. | |
| 5,442,223 A * | 8/1995 | Fujii .............................. | 257/508 |
| 5,495,124 A * | 2/1996 | Terashima ..................... | 257/409 |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |

(Continued)

OTHER PUBLICATIONS

Niehenke, E. C., et al., "Microwave and Millimeter-Wave Integrated Circuits," IEEE Transactions on Microwave Theory and Techniques, vol. 50, No. 3, Mar. 2002, pp. 846-857.

(Continued)

*Primary Examiner* — Stephen W Smoot
*Assistant Examiner* — Sun M Kim
(74) *Attorney, Agent, or Firm* — Slater & Matsil, L.L.P.

(57) ABSTRACT

A device includes a substrate having a front surface and a back surface; an integrated circuit device at the front surface of the substrate; and a metal plate on the back surface of the substrate, wherein the metal plate overlaps substantially an entirety of the integrated circuit device. A guard ring extends into the substrate and encircles the integrated circuit device. The guard ring is formed of a conductive material. A through substrate via (TSV) penetrates through the substrate and electrically couples to the metal plate.

20 Claims, 4 Drawing Sheets

(56) References Cited

U.S. PATENT DOCUMENTS

| | | | |
|---|---|---|---|
| 6,841,883 B1 | 1/2005 | Farnworth et al. | |
| 6,853,040 B2 * | 2/2005 | Jang et al. | 257/409 |
| 6,879,023 B1 * | 4/2005 | Gutierrez | 257/409 |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,530 B1 * | 7/2006 | Ding et al. | 257/508 |
| 7,071,546 B2 | 7/2006 | Fey et al. | |
| 7,105,910 B2 * | 9/2006 | Ishio et al. | 257/535 |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,511,346 B2 | 3/2009 | Yeh et al. | |
| 7,541,652 B1 * | 6/2009 | Abughazaleh | 257/500 |
| 7,582,938 B2 * | 9/2009 | Chen | 257/409 |
| 7,833,876 B2 * | 11/2010 | Akagi et al. | 257/409 |
| 8,133,774 B2 * | 3/2012 | Botula et al. | 438/164 |
| 8,164,113 B2 * | 4/2012 | Lin et al. | 257/774 |
| 8,237,225 B2 * | 8/2012 | Kato | 257/355 |
| 2005/0179111 A1 * | 8/2005 | Chao | 257/510 |
| 2006/0163688 A1 | 7/2006 | Ding et al. | |
| 2008/0073747 A1 | 3/2008 | Chao et al. | |
| 2009/0090995 A1 | 4/2009 | Yang et al. | |
| 2009/0127652 A1 * | 5/2009 | Ding et al. | 257/508 |

OTHER PUBLICATIONS

Hsu, T.-L., et al., "psub Guard Ring Design and Modeling for the Purpose of Substrate Noise Isolation in the SOC Era," IEEE Electron Device Letters, vol. 26., No. 9, Sep. 2005, pp. 693-695.

Voldman, S. H., et al., "Guard Rings: Theory, Experimental Quantification and Design," 2005 EOS/ESD Symposium, IBM Microelectronics, Essex Junction, Vermont, 10 pgs.

* cited by examiner

NOISE DECOUPLING STRUCTURE WITH THROUGH-SUBSTRATE VIAS

BACKGROUND

Recent advances in the radio frequency (RF) device design and fabrication make possible the integration of high-frequency RF device in a three-dimensional (3D) structure. The use of the high-frequency RF devices causes severe noise coupling between devices. For example, analog circuits such as differential amplifiers are extremely sensitive to the noise at the differential inputs, and hence are specially affected by the noise generated in the 3D structures. This significantly limits the performance of the circuits comprising high-frequency RF devices. Therefore, noise isolation structures are needed to prevent the noise coupling between devices. With the use of high-frequency RF devices, the requirement of preventing noise coupling becomes more demanding.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel noise decoupling structure is provided in accordance with an embodiment. The variations and the operation of the embodiments are then discussed. Throughout the various views and illustrative embodiments, like reference numbers are used to designate like elements. Throughout the description, a noise decoupling structure for isolating an n-type device, which is further formed in a p-well region, is used as an example. One skilled in the art will realize the noise decoupling structures of p-type devices by applying the teaching of the embodiments of the present disclosure.

Figure 1A:
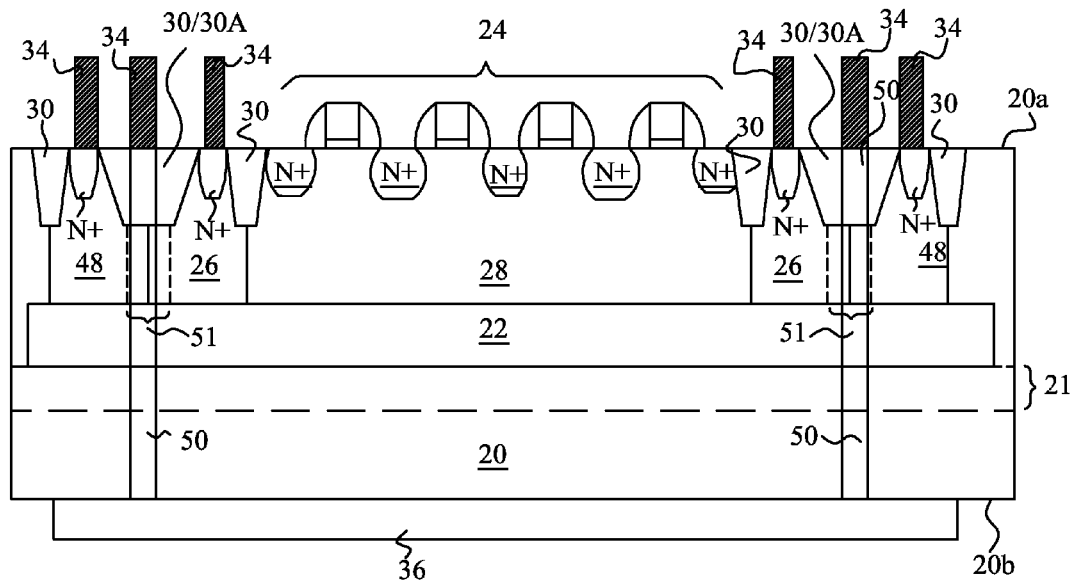
FIGS. 1A, 1B, and 1C illustrate a cross-sectional view, a top view, and a perspective view, respectively, of a noise decoupling structure.
Figure 1B:
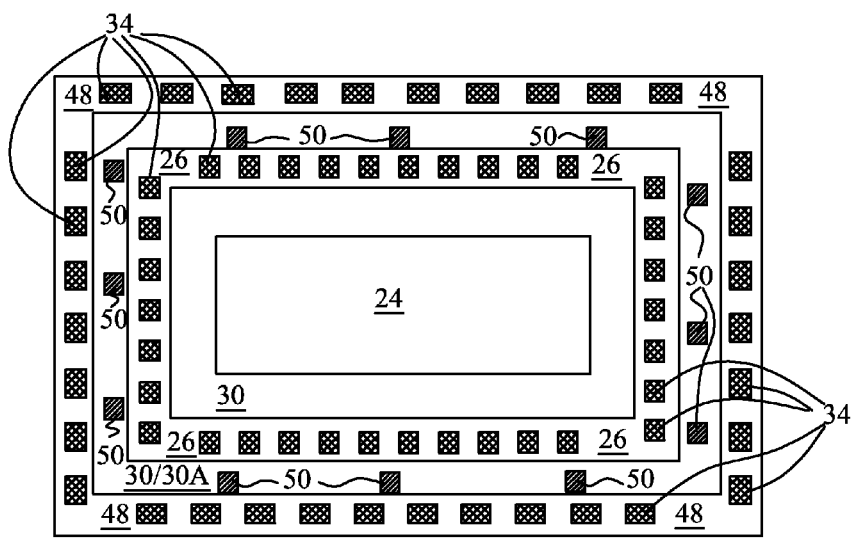
Figure 1C:
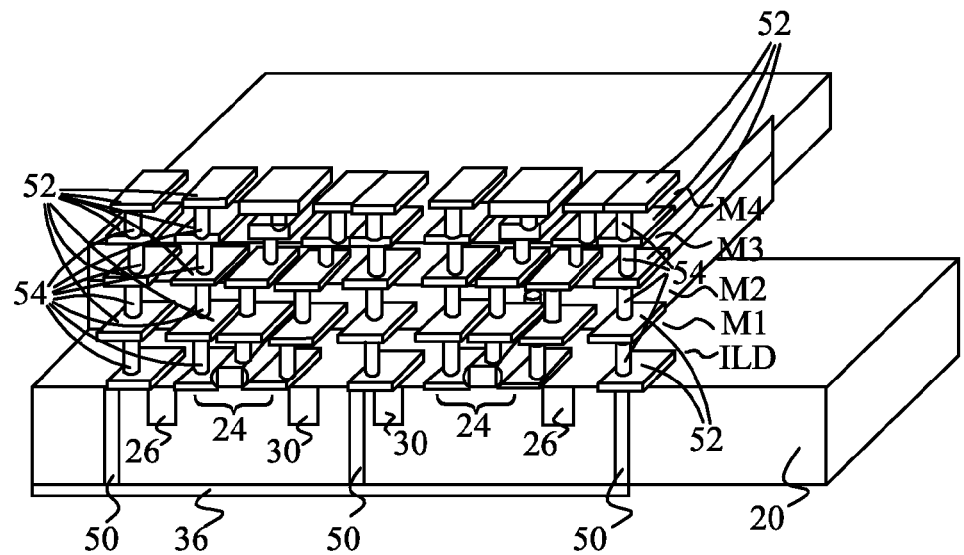

FIGS. 1A, 1B, and 1C illustrate a cross-sectional view, a top view, and a perspective view, respectively, of a noise decoupling structure. Referring to FIG. 1A, the noise decoupling structure includes deep n-well region 22, guard ring 26, through substrate vias (TSVs) 50, and metal plate 36. Integrated circuit device 24 is formed adjacent front surface 20a of semiconductor substrate 20. In an embodiment, semiconductor substrate 20 is a bulk substrate comprising a semiconductor material such as silicon, silicon germanium, or the like. In alternative embodiments, semiconductor substrate 20 has a semiconductor-on-insulator (SOI) structure comprising buried oxide layer 21 (illustrated using dotted lines) formed between an overlying semiconductor layer and an underlying semiconductor layer. In an embodiment, semiconductor substrate 20 is lightly doped with a p-type impurity, although it may also be of n-type.

Integrated circuit device 24 may be a metal-oxide-semiconductor (MOS) device, which may further be a radio-frequency (RF) MOS device suitable for being operated at a high frequency, for example, higher than about 1 GHz. In alternative embodiments, integrated circuit device 24 may be a MOS varactor, an inductor, a bipolar junction transistor, a diode, or the like. Integrated circuit device 24 may include a single device or a plurality of devices. Guard ring 26 is formed in substrate 20, and may encircle (please also refer to FIG. 1B) integrated circuit device 24. In an embodiment, p-well region 28, on which n-type MOS device 24 may be formed, is encircled by, and may contact, guard ring 26. In which case, guard ring 26 is formed of an n-well region. Shallow trench isolation (STI) regions 30 may be formed in substrate 20, and the depth of guard ring 26 is greater than the depth of STI regions 30. Further, deep n-well region 22 is formed directly underlying, and may contact, p-well region 28. Deep n-well region 22 may contact guard ring 26, and forms an uncapped box along with guard ring 26, with guard ring 26 forming the sides of the uncapped box, and deep n-well region 22 forming the bottom of the uncapped box.

Optionally, an additional guard ring 48, which may also be an n-well region, is formed to encircle guard ring 26. Guard ring 48 may also contact the underlying deep n-well region 22, and is horizontally spaced apart from guard ring 26 by STI region 30A, which also forms a ring encircling guard ring 26. In an embodiment, p-well region 51 may be between guard rings 26 and 48, and spaces guard rings 26 and 48 apart from each other. In an embodiment, guard rings 26 and 48 comprise upper portions laterally spaced apart by STI region 30A, and bottom portions contacting with each other. In alternative embodiments, p-well region 51 exists under STI region 30A, and is between and contacting guard rings 26 and 48. Contact plugs 34 are formed over, and are electrically coupled to, guard rings 26 and 48. Guard rings 26 and 48 may be grounded, for example, through contact plugs 34.

Metal plate 36 is formed on the backside of substrate 20, and may contact back surface 20b of substrate 20. The size of metal plate 36 is great enough to overlap an entirety of integrated circuit device 24, and may be even greater to extend to directly under, and vertically overlapping, an entirety of guard ring 26. Further, if guard ring 48 is formed, metal plate 36 may also extend to directly under, and vertically overlapping, an entirety of guard ring 48. Metal plate 36, however, does not cover all of the backside of semiconductor substrate 20. In an embodiment, metal plate 36 is formed of copper, aluminum, silver, and/or the like.

Through substrate vias (TSVs) 50 are formed adjacent integrated circuit device 24, and extend from the top surface 20a to back surface 20b of substrate 20. TSVs 50 contact, and are electrically coupled to, metal plate 36, which may be grounded. In an embodiment, only one TSV 50 is formed. In alternative embodiments, a plurality of TSVs 50 are formed, and may be distributed substantially uniformly through four sides surrounding integrated circuit device 24 (refer to FIG. 1B and FIGS. 2 through 4). TSVs 50 may penetrate through STI region 30A, and possibly penetrates deep n-well region 22. Further, if guard rings 26 and/or 48 extend to directly under STI region 30A, TSVs 50 may also penetrate through guard rings 26 and/or 48. TSVs 50 may also be grounded, for example, through contact plugs 34.

FIG. 1B illustrates a top view of the structure shown in FIG. 1A, which illustrated that guard rings 26 and 48 are formed to encircle integrated circuit device 24. Further, TSVs 50 may be formed outside or inside guard ring 26. TSVs 50 may be aligned to a rectangle, with TSVs 50 allocated along each side of the rectangle.

FIG. 1C illustrates a perspective view of the structure shown in FIGS. 1A and 1B. An interconnect structure including metal lines 52 and vias 54, which are electrically coupled to TSVs 50 and integrated circuit device 24, is also illustrated. The portions of metal lines 52 and vias 54 that are electrically coupled to TSVs 50 may extend to upper metal layers such as the bottom metal layer (M1), the second metal layer (M2), the third metal layer (M3), the fourth metal layer (M4), and the overlying metal layers (not shown).

Figure 2:
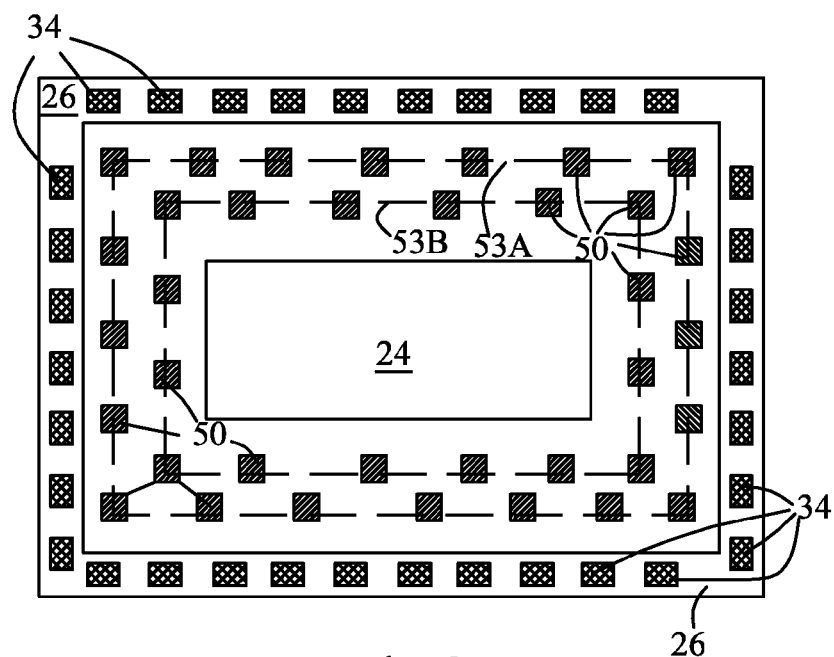
FIGS. 2, 3A and 4 are top views of noise decoupling structures in accordance with various alternative embodiments.
Figure 3A:
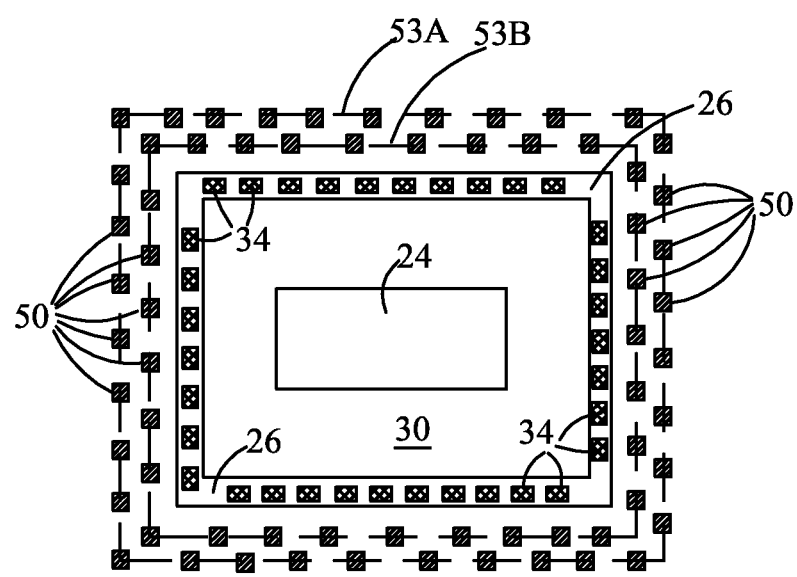
Figure 3B:
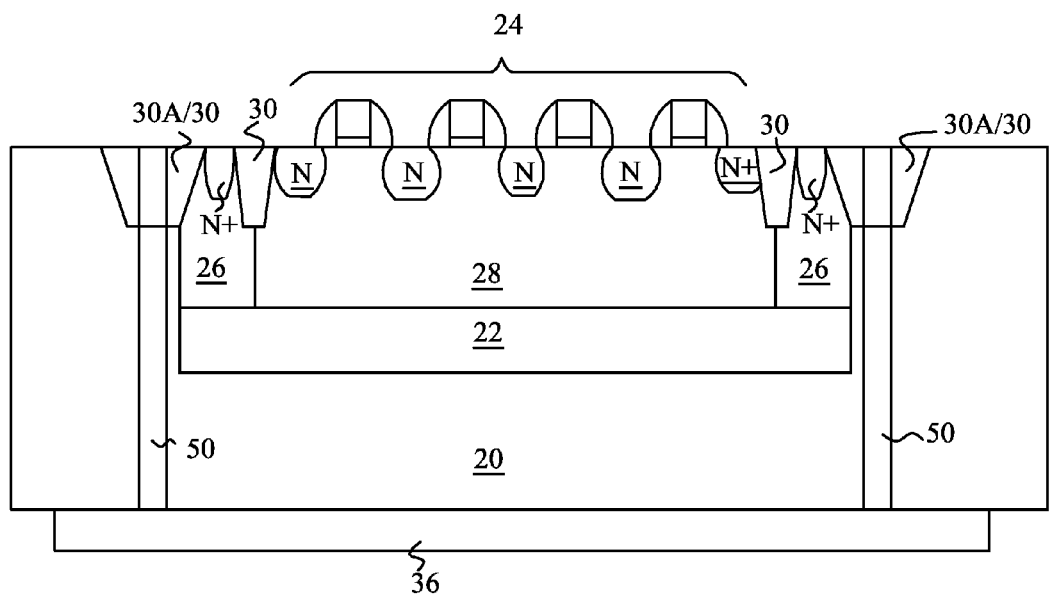
FIG. 3B illustrates a cross-sectional view of the structure shown in FIG. 3A.

FIGS. 2 and 3A illustrate the top views of alternative embodiments, in which only one guard ring is formed to encircle integrated circuit device 24. FIG. 3B illustrates a cross-sectional view of the structure shown in FIG. 3A. Referring to FIG. 2, TSVs 50 are formed inside guard ring 26. Similar to the embodiment shown in FIGS. 1A through 1C, in these embodiments, TSVs 50 are formed outside the active region of integrated circuit 24 if it comprises a MOS device(s) or a MOS varactor(s). In FIG. 3A, TSVs 50 are formed outside guard ring 26. In each of the embodiments as shown in FIGS. 2 and 3A/3B, deep n-well region 22 (not shown in FIGS. 2 and 3A, please refer to FIGS. 1A and 3B) may be formed directly underlying integrated circuit device 24, and may extend to directly underlying STI region 30A and guard ring 26. In the embodiment shown in FIG. 2, TSVs 50 may also penetrate through the underlying deep n-well region 22. Alternatively, as shown in FIG. 3B, deep n-well region 22 does not extend to TSVs 50, and hence TSVs 50 do not penetrate through deep n-well region 22.

As also shown in FIGS. 2 and 3A, TSVs 50 may be allocated to each of the four sides of a rectangular region surrounding device 24, and may be aligned to one or more than one rectangles. For example, in FIGS. 2 and 3A, TSVs 50 are aligned to the four sides of rectangles 53A and 53B.

Figure 4:
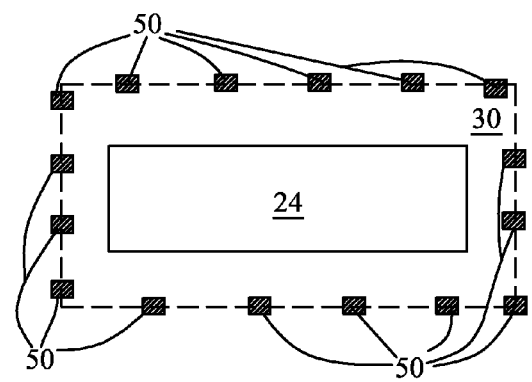

FIG. 4 illustrates yet another embodiment, wherein no guard ring is formed. However, TSVs 50 are still formed, and are electrically coupled to underlying metal plate 36 (not shown in FIG. 4, please refer to FIG. 1A), which is directly underlying, and vertically overlapping, integrated circuit device 24.

Although the discussed embodiments provide a method of forming a noise decoupling structure for an n-type MOS device, one skilled in the art will realize that the teaching provided is readily available for the formation of noise decoupling structures for p-type MOS devices, with the conductivity types of the respective well regions and guard rings inverted.

By forming metal plate 36 on the backside of the respective substrate, and by grounding the metal plate, integrated circuits may, in addition to be isolated by guard rings and deep well regions, also be isolated from noise by the underlying metal plates. The metal plates may collect the electrons leaked from devices, and hence the signal coupling in the vertical direction, particularly in three-dimensional (3D) structures, is prevented. Accordingly, better signal isolation may be achieved.

In accordance with embodiments, a device includes a substrate having a front surface and a back surface; an integrated circuit device at the front surface of the substrate; and a metal plate on the back surface of the substrate, wherein the metal plate overlaps substantially an entirety of the integrated circuit device. A guard ring extends into the substrate and encircles the integrated circuit device. The guard ring is formed of a conductive material. A TSV penetrates through the substrate and electrically couples to the metal plate.

In accordance with other embodiments, a semiconductor substrate includes a front surface and a back surface; an integrated circuit device at the front surface of the substrate; a metal plate on the back surface of the substrate, wherein the metal plate overlaps substantially an entirety of the integrated circuit device; a guard ring extending into the substrate and encircling the integrated circuit device, wherein the guard ring is formed of a first well region; a deep well region directly underlying the integrated circuit device and contacting the guard ring, wherein the guard ring and the deep well region are of a same conductivity type; and a TSV penetrating through the substrate and the deep well region, and electrically coupled to the metal plate.

In accordance with yet other embodiments, a device includes a p-type semiconductor substrate; a deep n-well region in the semiconductor substrate; a p-well region over and contacting the deep well region; a guard ring formed of an n-well region in the p-type semiconductor substrate and encircling the p-well region, wherein the guard ring extends from a front surface of the p-type semiconductor substrate into the p-type semiconductor substrate, and wherein the guard ring contacts the deep n-well region; a metal plate contacting a back surface of the semiconductor substrate; and a TSV penetrating through the p-type semiconductor substrate and contacting the metal plate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
  a substrate comprising a front surface and a back surface;
  an integrated circuit device at the front surface of the substrate;
  a metal plate on the back surface of the substrate, wherein the metal plate overlaps substantially an entirety of the integrated circuit device;
  a guard ring extending into the substrate and encircling the integrated circuit device, wherein the guard ring is formed of a conductive material;
  a through substrate via (TSV) penetrating through the substrate and electrically coupled to the metal plate; and
  an additional guard ring encircling the guard ring, the additional guard ring formed of an n-well region in the substrate;
  wherein the TSV is laterally between the guard ring and the additional guard ring.

2. The device of claim 1, wherein the guard ring comprises a well region forming a well ring.

3. The device of claim 1 further comprising a deep well region directly underlying the integrated circuit device and electrically coupled to the guard ring.

4. The device of claim 3, wherein the TSV penetrates through the deep well region.

5. The device of claim 3 further comprising a shallow trench isolation (STI) region adjacent the integrated circuit device, wherein the TSV penetrates through the STI region.

6. The device of claim 1, wherein the TSV is outside the guard ring.

7. The device of claim 1, wherein the TSV is inside the guard ring, and is laterally between the integrated circuit device and the guard ring.

8. The device of claim 1, wherein the conductive material of the guard ring comprises an n-well region.

9. The device of claim 8, wherein the guard ring and the additional guard ring are disposed over a deep n-well region.

10. The device of claim 1, wherein the substrate has a semiconductor-on-insulator (SOI) structure.

11. A device comprising:
a semiconductor substrate comprising a front surface and a back surface;
an integrated circuit device at the front surface of the substrate;
a metal plate on the back surface of the substrate, wherein the metal plate overlaps substantially an entirety of the integrated circuit device;
a first guard ring extending into the substrate and encircling the integrated circuit device, wherein the first guard ring is formed of a first well region;
a deep well region directly underlying the integrated circuit device and contacting the first guard ring, wherein the first guard ring and the deep well region are of a same conductivity type;
a through substrate via (TSV) penetrating through the substrate and the deep well region, and electrically coupled to the metal plate;
a second guard ring encircling the first guard ring, the second guard ring formed of an n-well region in the semiconductor substrate; and
a second well region directly over the deep well region, wherein the second well region is encircled by, and contacts, the first guard ring, and wherein the second well region and the deep well region are of opposite conductivity types.

12. The device of claim 11, wherein the first guard ring and the TSV are grounded.

13. The device of claim 11 further comprising a plurality of TSVs penetrating through the substrate and the deep well region and electrically coupled to the metal plate, wherein the plurality of TSVs and the TSV are distributed substantially uniformly surrounding the integrated circuit device.

14. The device of claim 11, wherein the TSV is laterally between the first and the second guard rings, wherein the TSV penetrates through a shallow trench isolation (STI) region disposed laterally between the first and the second guard rings, and wherein the STI region forms a ring encircling the first guard ring.

15. The device of claim 11, wherein the semiconductor substrate has a semiconductor-on-insulator (SOI) structure, with the TSV penetrating through the SOI structure.

16. A device comprising:
a p-type semiconductor substrate;
a deep n-well region in the semiconductor substrate;
a p-well region over and contacting the deep well region;
a guard ring formed of an n-well region in the p-type semiconductor substrate and encircling the p-well region, wherein the guard ring extends from a front surface of the p-type semiconductor substrate into the p-type semiconductor substrate, and wherein the guard ring contacts the deep n-well region;
a metal plate contacting a back surface of the semiconductor substrate;
a through substrate via (TSV) penetrating through the p-type semiconductor substrate and contacting the metal plate; and
an additional guard ring formed of an additional n-well region in the semiconductor substrate and encircling the guard ring, the additional guard ring extending from the front surface of the p-type semiconductor substrate into the p-type semiconductor substrate, and wherein the TSV is laterally between the guard ring and the additional guard ring.

17. The device of claim 16 further comprising an integrated circuit device comprising at least a portion in the p-well region and encircled by the guard ring, wherein the integrated circuit device is selected from the group consisting essentially of a metal-oxide-semiconductor (MOS) device, a MOS varactor, an inductor, and combinations thereof.

18. The device of claim 16, wherein the TSV penetrates through the deep n-well region.

19. The device of claim 16, wherein the TSV is inside the guard ring.

20. The device of claim 16, wherein the TSV is outside the guard ring, and wherein the deep well region overlaps an entirety of the p-well region and an entirety of the guard ring, and laterally extends beyond outer boundaries of the guard ring, and wherein the TSV penetrates through the deep n-well region.

* * * * *